(12) United States Patent
Asao et al.

(10) Patent No.: US 10,559,750 B2
(45) Date of Patent: Feb. 11, 2020

(54) NONVOLATILE MEMORY DEVICE AND METHOD OF MANUFACTURING THE SAME

(71) Applicant: KABUSHIKI KAISHA TOSHIBA, Minato-ku (JP)

(72) Inventors: Yoshiaki Asao, Tsukuba (JP); Misako Morota, Taito (JP); Yoshiki Kamata, Tsukuba (JP); Yukihiro Nomura, Taito (JP); Iwao Kunishima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/119,128

(22) Filed: Aug. 31, 2018

(65) Prior Publication Data
US 2019/0288193 A1 Sep. 19, 2019

(30) Foreign Application Priority Data
Mar. 19, 2018 (JP) .................................. 2018-051458

(51) Int. Cl.
*H01L 45/00* (2006.01)
*H01L 27/24* (2006.01)

(52) U.S. Cl.
CPC .............. *H01L 45/06* (2013.01); *H01L 27/24* (2013.01); *H01L 45/1233* (2013.01); *H01L 45/144* (2013.01); *H01L 45/1675* (2013.01)

(58) Field of Classification Search
CPC ... H01L 27/24; H01L 27/101; H01L 27/2463; H01L 27/2436; H01L 27/2481;

(Continued)

(56) References Cited

U.S. PATENT DOCUMENTS 7,838,877 B2 * 11/2010 Aoki ...................... B82Y 10/00
                                                    257/43
8,575,589 B2 * 11/2013 Nagashima ........... H01L 27/101
                                                    257/5

(Continued)

FOREIGN PATENT DOCUMENTS

JP       2006-303294        11/2006
JP       2006-351992        12/2006

(Continued)

OTHER PUBLICATIONS

R. E. Simpson, et al., "Interfacial phase-change memory," Nature Nanotechnology, vol. 6, No. 8, Jul. 2011, pp. 1-5.

*Primary Examiner* — Nikolay K Yushin
(74) *Attorney, Agent, or Firm* — Oblon, McClelland, Maier & Neustadt, L.L.P.

(57) ABSTRACT

According to one embodiment, a nonvolatile memory device includes a first conductive portion, an insulating film surrounding a side surface of the first conductive portion, an intermediate layer provided on the first conductive portion and the insulating film, a first film including a first portion provided on the intermediate layer and at least one second portion provided in the intermediate layer and outside an upper edge of the first conductive portion, the first film including, above the first conductive portion, a resistance change portion that has a first resistance state and a second resistance state having resistance higher than resistance in the first resistance state, and a second conductive portion provided at least on the resistance change portion.

14 Claims, 16 Drawing Sheets

(58) Field of Classification Search
CPC ............... H01L 45/1233; H01L 45/144; H01L 45/1675; H01L 45/06
See application file for complete search history.

(56) References Cited

U.S. PATENT DOCUMENTS

| | | | |
|---|---|---|---|
| 9,142,771 B2* | 9/2015 | Hidaka | ................. H01L 45/144 |
| 2009/0034123 A1* | 2/2009 | Aoki | ....................... B82Y 10/00 |
| | | | 360/135 |
| 2009/0121208 A1* | 5/2009 | Nagashima | ........... H01L 27/101 |
| | | | 257/2 |
| 2009/0134379 A1 | 5/2009 | Kakegawa | |
| 2010/0072451 A1 | 3/2010 | Terao et al. | |

FOREIGN PATENT DOCUMENTS

| JP | 2009-130176 | 6/2009 |
|---|---|---|
| WO | WO 2008/010290 A1 | 1/2008 |

* cited by examiner

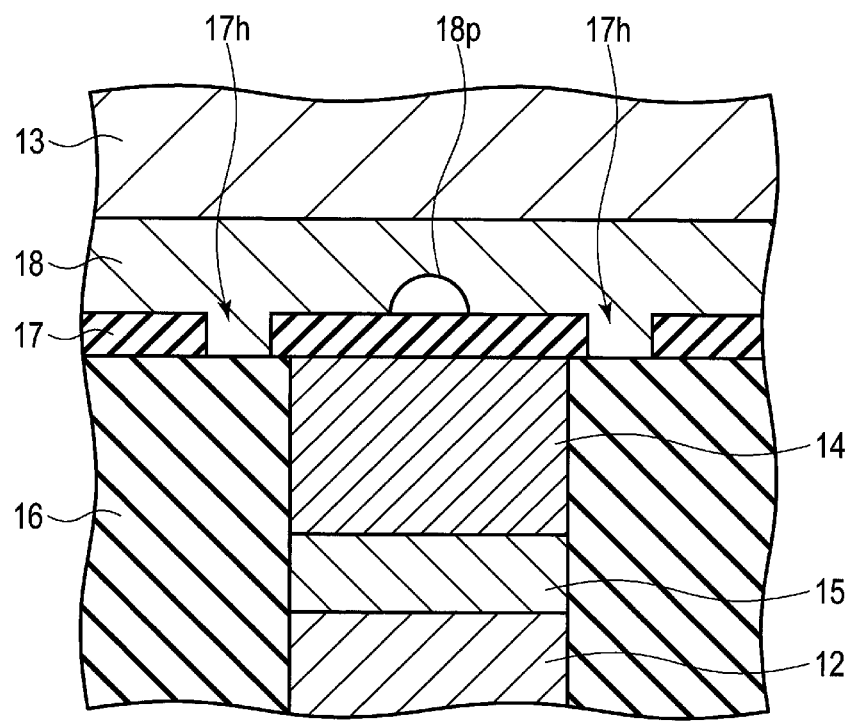
F I G. 3A
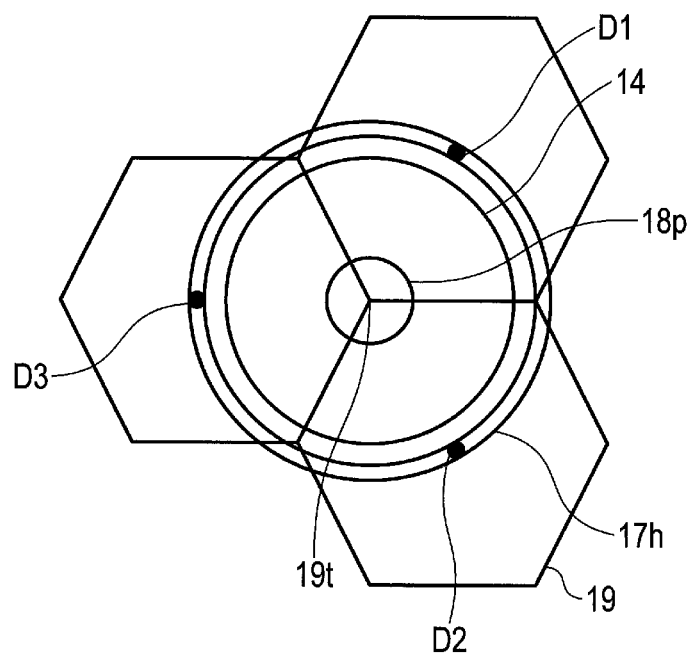
F I G. 3B

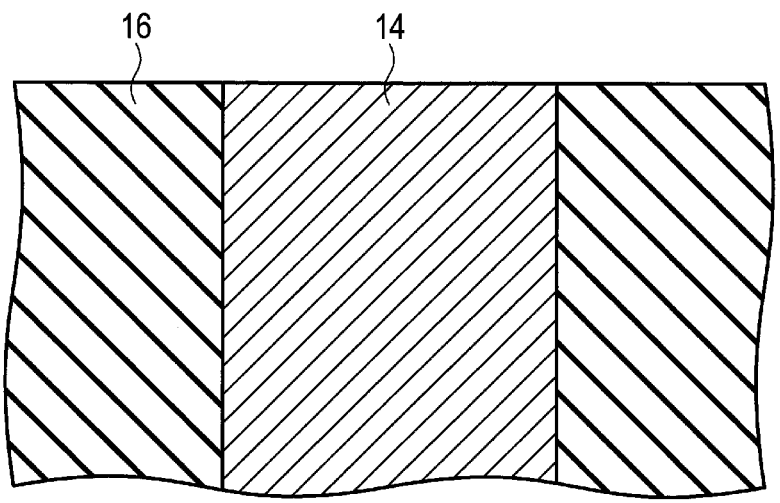
F I G. 5A
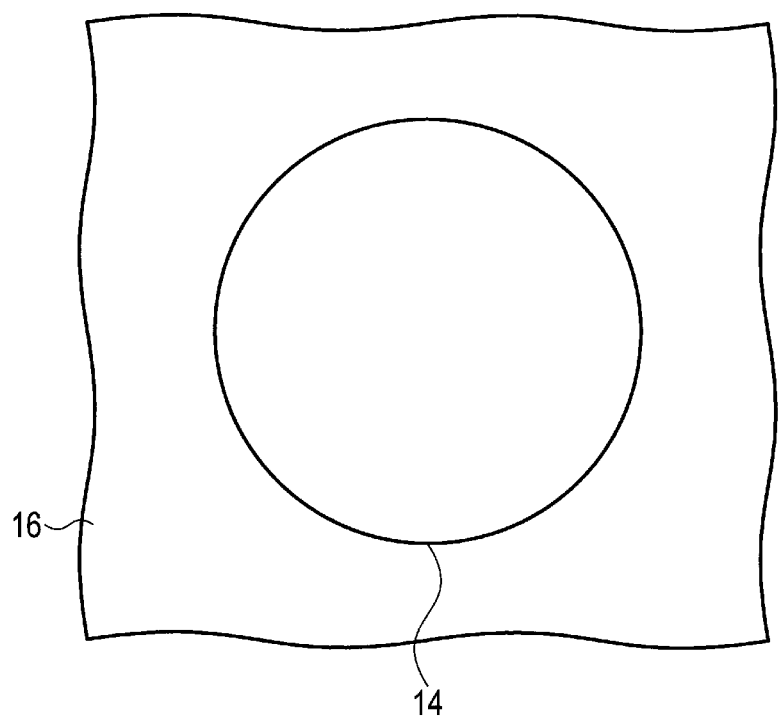
F I G. 5B

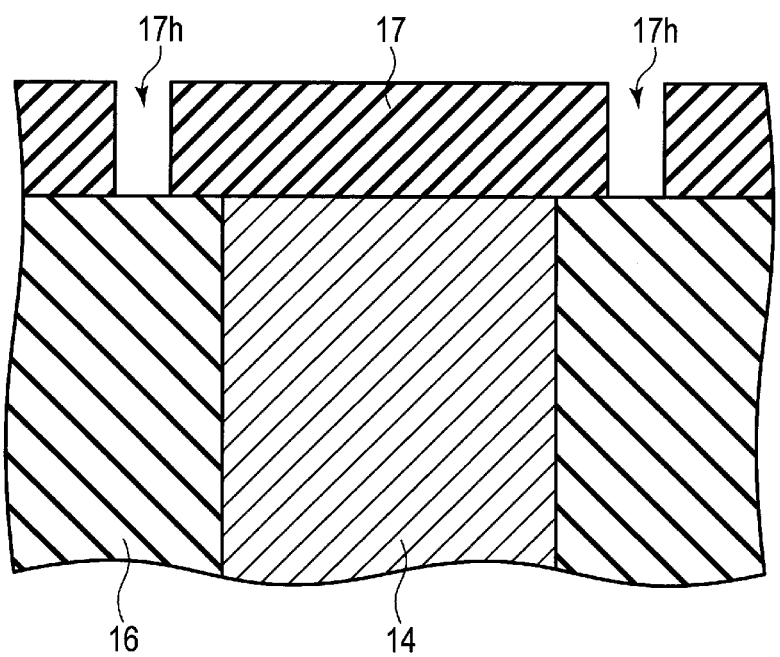
F I G. 8A
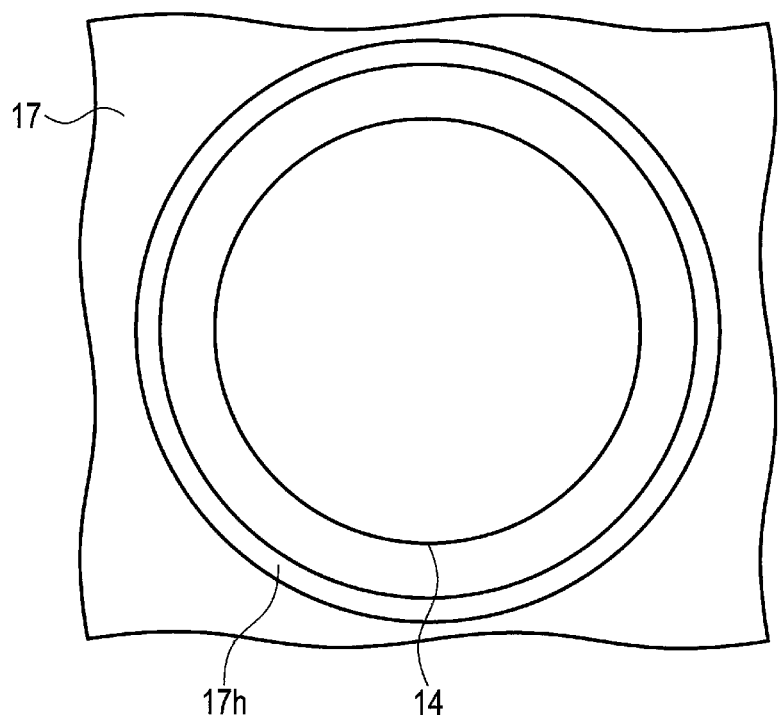
F I G. 8B

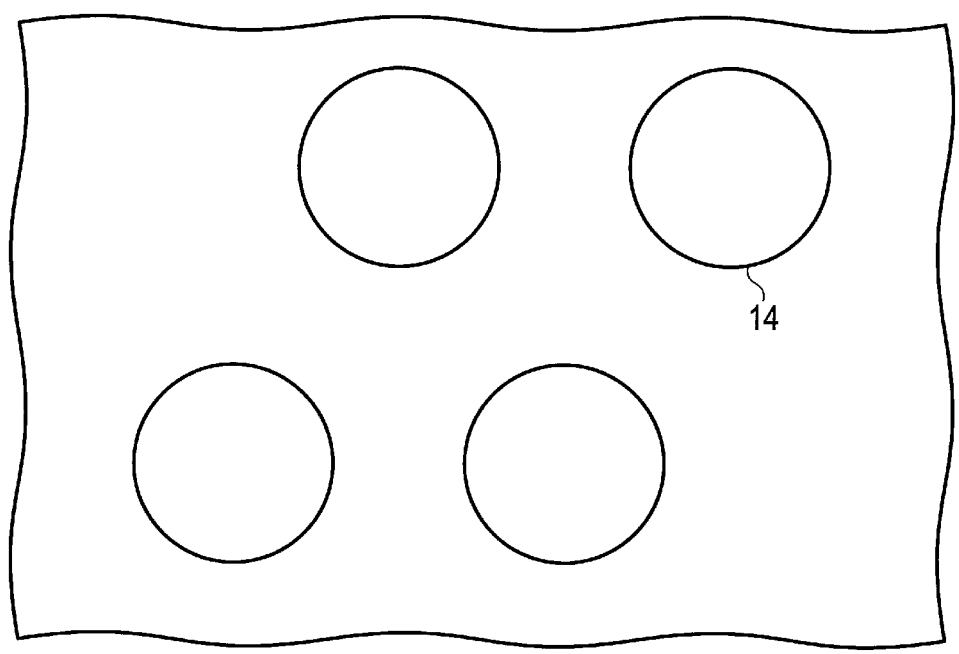
F I G. 11
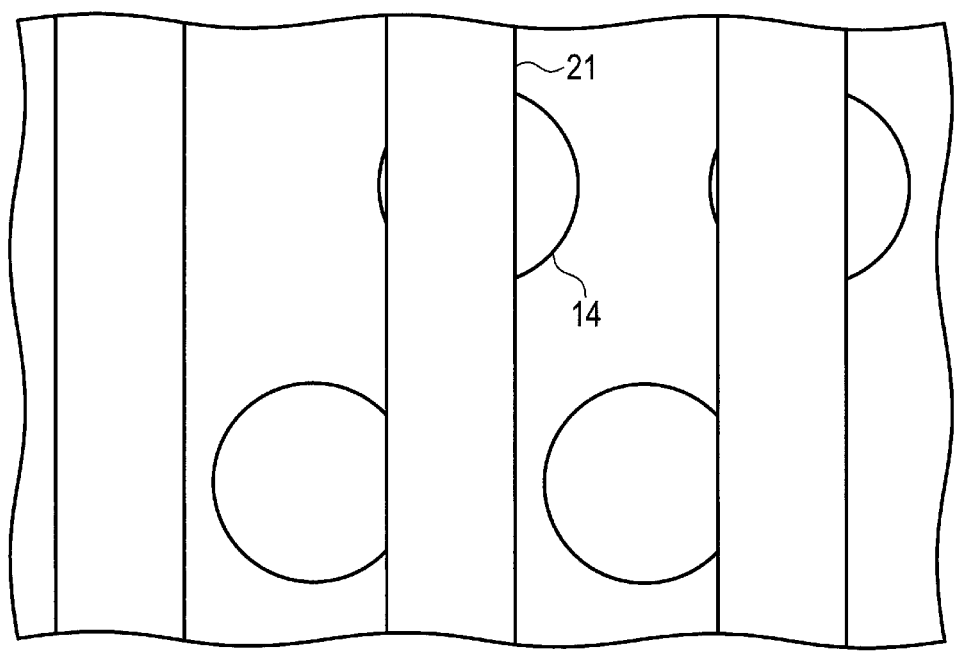
F I G. 12

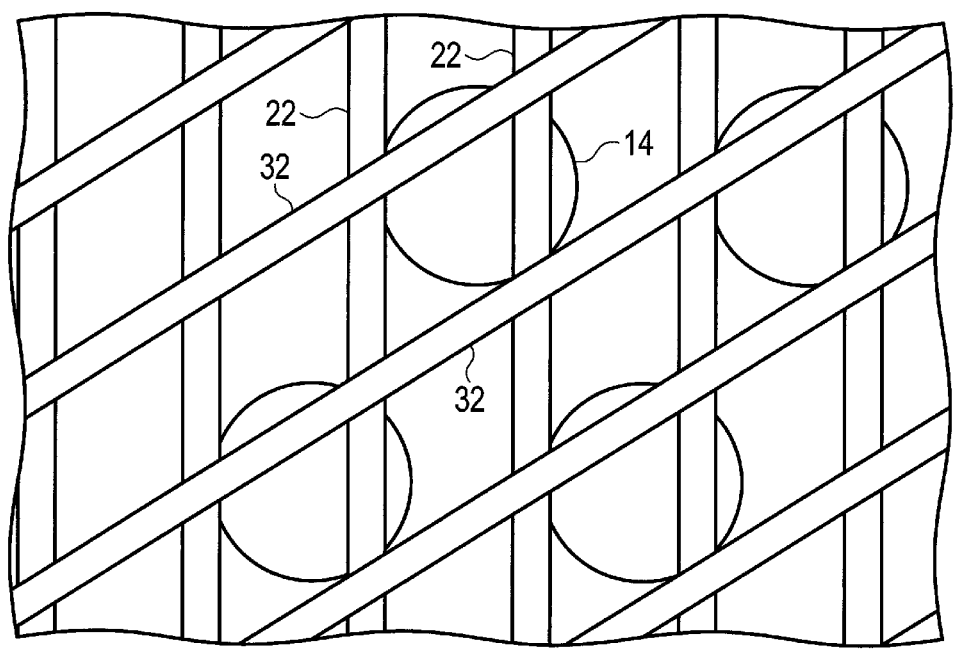
F I G. 17
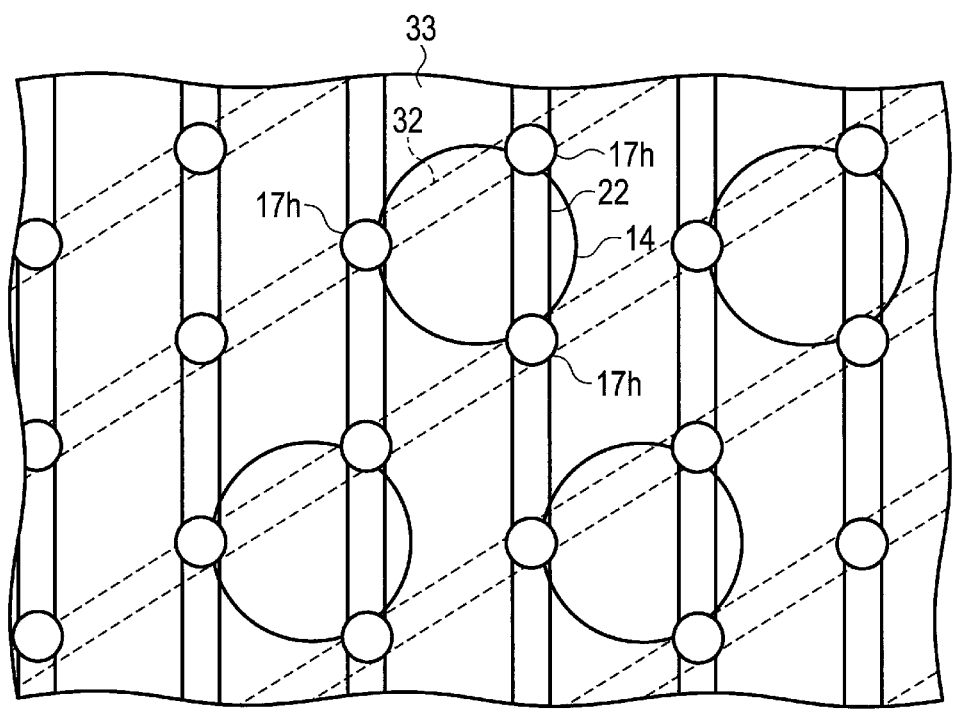
F I G. 18

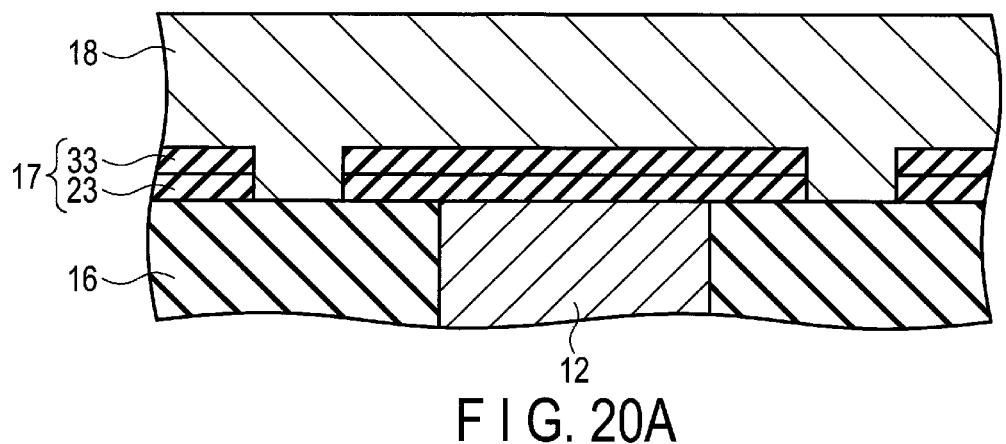
F I G. 20A
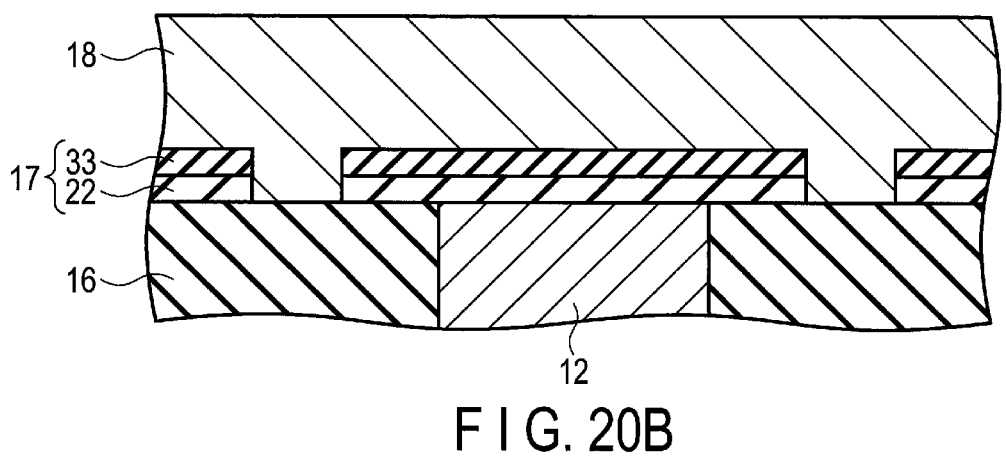
F I G. 20B
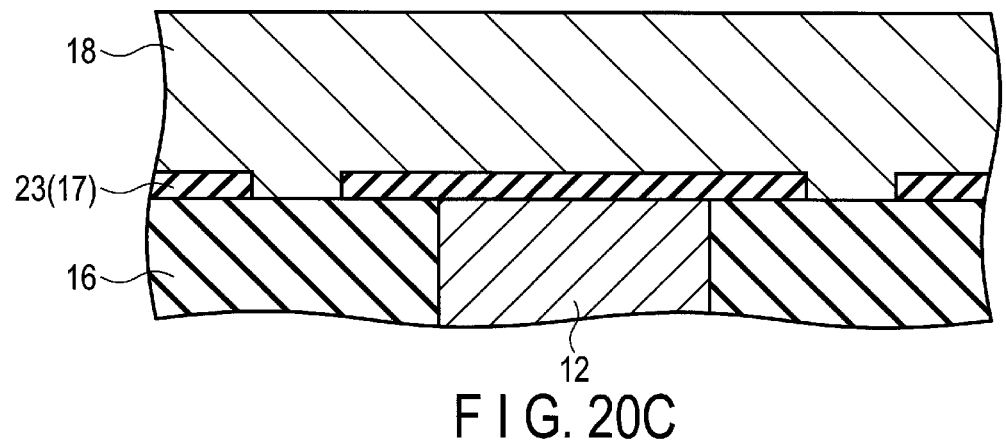
F I G. 20C

US 10,559,750 B2

NONVOLATILE MEMORY DEVICE AND METHOD OF MANUFACTURING THE SAME

CROSS-REFERENCE TO RELATED APPLICATIONS

This application is based upon and claims the benefit of priority from Japanese Patent Application No. 2018-051458, filed Mar. 19, 2018, the entire contents of which are incorporated herein by reference.

FIELD

Embodiments described herein relate generally to a nonvolatile memory device and a method of manufacturing the same.

BACKGROUND

Superlattice type interfacial phase change memories (IPCM) have been proposed as a resistance change nonvolatile memory device.

Unfortunately, conventional resistance change nonvolatile memory devices are far from having excellent performance in terms of, for example, lowering current.

BRIEF DESCRIPTION OF THE DRAWINGS

FIG. 3A is a cross-sectional view schematically illustrating a detailed configuration of the nonvolatile memory device according to the first embodiment;

FIG. 3B is a plan view schematically illustrating the detailed configuration of the nonvolatile memory device according to the first embodiment;

FIG. 5A is a cross-sectional view schematically illustrating a part of a method of manufacturing the nonvolatile memory device according to the first embodiment;

FIG. 5B is a plan view schematically illustrating the part of the method of manufacturing the nonvolatile memory device according to the first embodiment;

FIG. 8A is a cross-sectional view schematically illustrating a part of the method of manufacturing the nonvolatile memory device according to the first embodiment;

FIG. 8B is a plan view schematically illustrating the part of the method of manufacturing the nonvolatile memory device according to the first embodiment;

FIG. 11 is a plan view schematically illustrating a part of a method of manufacturing the nonvolatile memory device according to the second embodiment;

FIG. 12 is a plan view schematically illustrating a part of the method of manufacturing the nonvolatile memory device according to the second embodiment;

FIG. 17 is a plan view schematically illustrating a part of the method of manufacturing the nonvolatile memory device according to the second embodiment;

FIG. 18 is a plan view schematically illustrating a part of the method of manufacturing the nonvolatile memory device according to the second embodiment;

FIG. 20A is a cross-sectional view schematically illustrating a part of the method of manufacturing the nonvolatile memory device according to the second embodiment;

FIG. 20B is a cross-sectional view schematically illustrating the part of the method of manufacturing the nonvolatile memory device according to the second embodiment; and FIG. 20C is a cross-sectional view schematically illustrating the part of the method of manufacturing the nonvolatile memory device according to the second embodiment.

DETAILED DESCRIPTION

In general, according to one embodiment, a nonvolatile memory device includes: a first conductive portion; an insulating film surrounding a side surface of the first conductive portion; an intermediate layer provided on the first conductive portion and the insulating film; a first film including a first portion provided on the intermediate layer and at least one second portion provided in the intermediate layer and outside an upper edge of the first conductive portion, the first film including, above the first conductive portion, a resistance change portion that has a first resistance state and a second resistance state having resistance higher than resistance in the first resistance state; and a second conductive portion provided at least on the resistance change portion.

Embodiments will now be described with reference to the drawings.

First Embodiment

Figure 1:
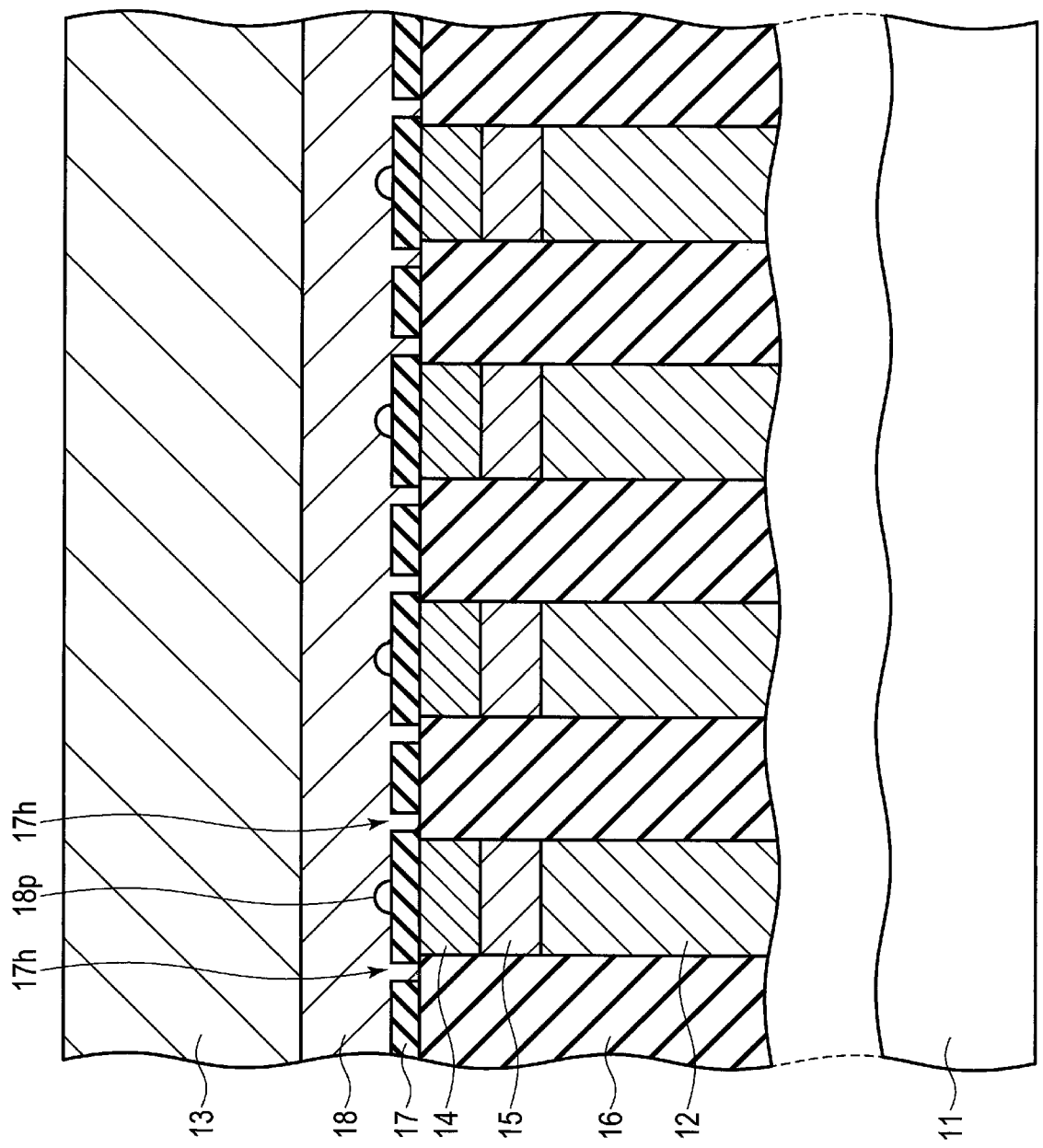
FIG. 1 is a cross-sectional view schematically illustrating a configuration of a resistance change nonvolatile memory device according to a first embodiment.
Figure 2:
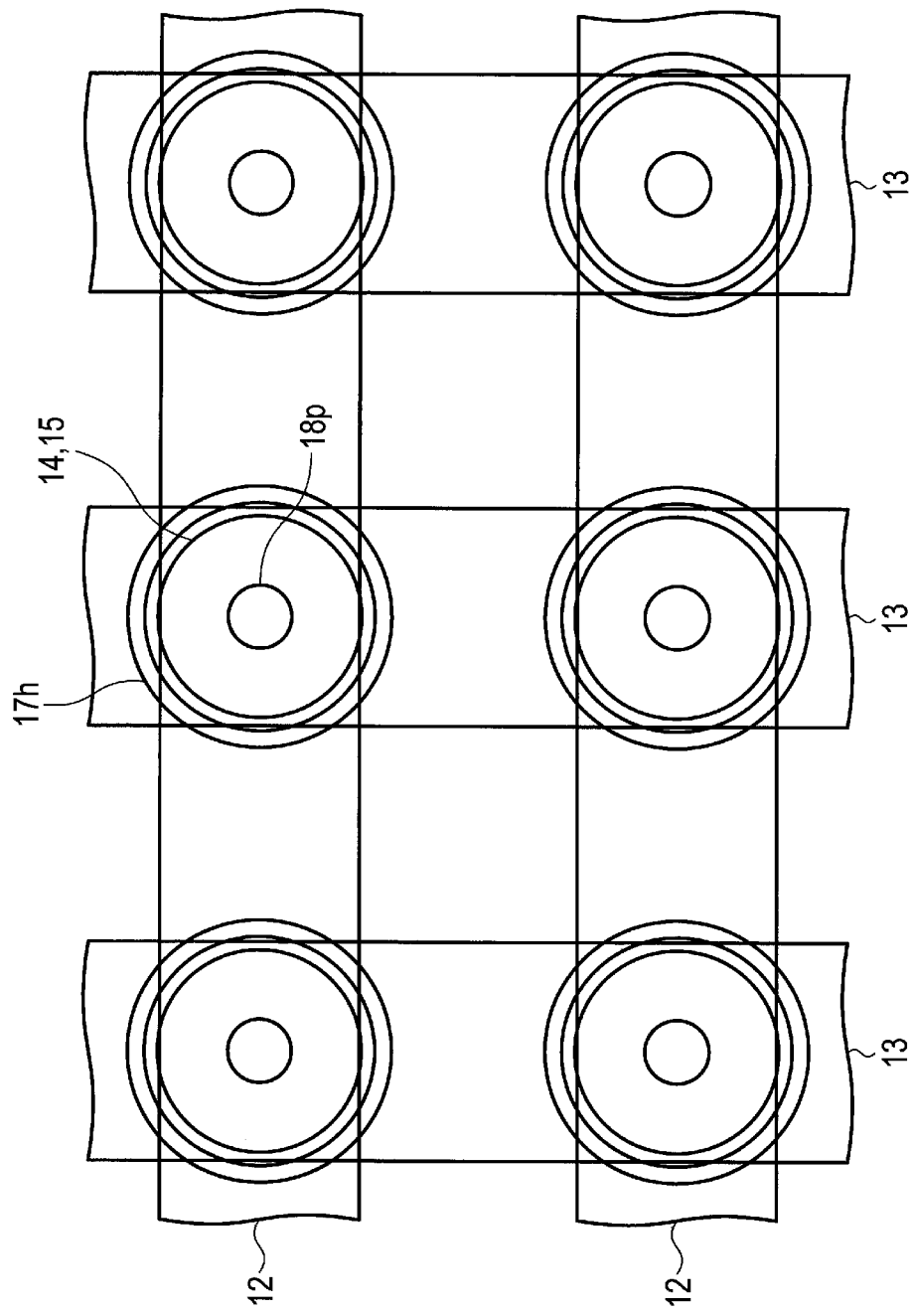
FIG. 2 is a plan view schematically illustrating the configuration of the resistance change nonvolatile memory device according to the first embodiment.

FIG. 1 is a cross-sectional view schematically illustrating a configuration of a resistance change nonvolatile memory device according to a first embodiment. FIG. 2 is a plan view schematically illustrating the configuration of the resistance change nonvolatile memory device according to the first embodiment.

A plurality of word lines (third conductive portions) 12 is provided on a semiconductor substrate (silicon substrate) 11. The word line 12 extends in an X direction and is arranged in a Y direction perpendicular to the X direction. The word line 12 is formed of tungsten (W).

A plurality of bit lines (second conductive portions) 13 is provided above the word line. The bit line 13 extends in the Y direction, and is arranged in the X direction. The bit line 13 also functions as an upper electrode of a resistance change memory element. The bit line 13 is formed of tungsten (W).

A lower electrode (first conductive portion) 14 of the resistance change memory element is provided between the word line 12 and the bit line 13. Specifically, the lower electrode 14 is provided at the intersection of the word line 12 and the bit line 13. The lower electrode 14 is formed of tungsten (W).

A rectifying element 15 functioning as a selector is provided between the word line 12 and the lower electrode 14. The rectifying element 15 is formed of an ovonic threshold switch (OTS) functioning as a bidirectional diode.

The side surfaces of the word line 12, the lower electrode 14 and the rectifying element 15 are surrounded by an interlayer insulating film 16. A silicon oxide film is used for the interlayer insulating film 16.

An intermediate layer 17 is provided on the lower electrode 14 and the interlayer insulating film 16. The intermediate layer 17 has a ring-shaped hole 17h near an upper edge of the lower electrode 14. The ring-shaped hole 17h surrounds the lower electrode 14 as viewed from a direction perpendicular to the upper surface of the lower electrode 14. In the embodiment, the intermediate layer 17 is formed of an insulating metal oxide such as a titanium oxide ($TiO_2$).

A predetermined material film (first film) 18 is provided on the intermediate layer 17 and in the hole 17h. In other words, the predetermined material film (first film) 18 includes a first portion and at least one second portion. The first portion is provided on the intermediate layer 17. The second portion is provided in the hole 17h of the intermediate layer 17 and outside the upper edge of the lower electrode 14. The predetermined material film 18 is formed of a superlattice film containing $Sb_2Te_3$ and GeTe. The predetermined material film 18 has a resistance change portion 18p above the lower electrode 14. The resistance change portion 18p is included in the first portion. The resistance change portion 18p has a first resistance state (low resistance state) and a second resistance state (high resistance state). The resistance in the second resistance state is higher than that in the first resistance state. Specifically, the resistance change portion 18p exhibits one of the first resistance state (low resistance state) and the second resistance state (high resistance state) depending on phase changes.

As described above, the lower electrode 14 and the rectifying element 15 are provided at the intersections of the word line 12 and the bit line 13, and the predetermined material film 18 is provided between the lower electrode 14 and the bit line 13. In such a configuration, a resistance change nonvolatile memory cell is constructed. Specifically, the resistance change portion 18p of the predetermined material film 18 is positioned between the word line 12 and the bit line 13. Therefore, the resistance between the word line 12 and the bit line 13 changes according to the resistance state (low and high resistance states) of the resistance change portion 18p. Binary information is stored based on the resistance change.

FIG. 3A is a cross-sectional view schematically illustrating a detailed configuration of the above-described nonvolatile memory device. FIG. 3B is a plan view schematically illustrating the detailed configuration of the above-described nonvolatile memory device.

Figure 4:
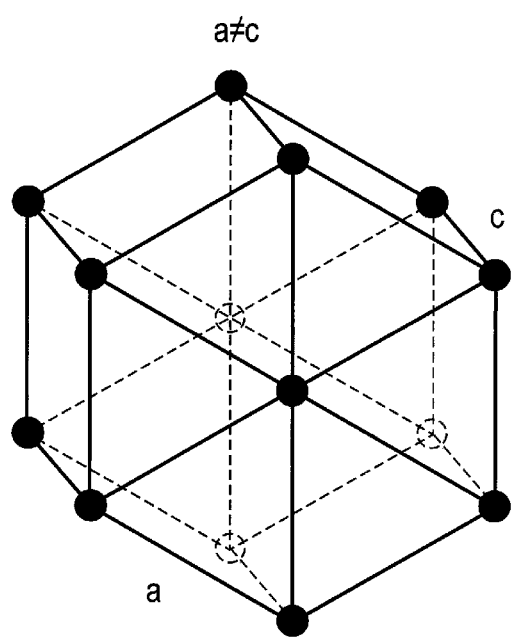
FIG. 4 schematic illustrates a crystal structure of a hexagonal system.

As already described above, the intermediate layer 17 has the hole 17h near the upper edge of the lower electrode 14. Specifically, the intermediate layer 17 has a ring-shaped hole (ring-shaped groove) 17h surrounding the lower electrode 14 as viewed from the direction perpendicular to the upper surface of the lower electrode 14. The predetermined material film 18 is crystal-grown starting from the ring-shaped hole (ring-shaped groove) 17h. As a result, three regular hexagonal crystal grains 19 each centered on three division points D1, D2, and D3 of the ring are formed as viewed from the direction perpendicular to the upper surface of the lower electrode 14. Consequently, a triple point 19t in which the crystal grain boundaries of the three crystal grains 19 are gathered is obtained. The predetermined material film 18 has, for example, the lowermost layer of $Sb_2Te_3$ of a hexagonal system. The hexagonal system has a crystal structure as illustrated in FIG. 4. In the embodiment, the three crystal grains 19 are oriented in a c-axis direction. Rotational directions of the three crystal grains 19 around the c-axis are different from each other.

Electrical resistance is low at the above-described triple point 19t due to a concentration of the crystal grain boundaries at the triple point 19t. Therefore, when a voltage is applied between the word line 12 and the bit line 13 (between the lower electrode 14 and the bit line 13), the insulating intermediate layer 17 undergoes dielectric breakdown (electrostatic breakdown) at the triple point 19t, and a pinhole is generated. The pinhole functions as a current path, and current flows through the pinhole, whereby elements (Ge, Sb, Te) contained in the crystal grain 19 are precipitated at the triple point 19t and the triple point 19t functions similarly to an alloy type phase change memory. As a result, a region near the pinhole of the predetermined material film 18 becomes the resistance change portion 18p. That is, the resistance change portion 18p is obtained at a position of the triple point 19t where the crystal grain boundaries of the three crystal grains contained in the predetermined material film 18 are gathered. The resistance change portion 18p is located at a central portion of the upper surface of the lower electrode 14 as viewed from the direction perpendicular to the upper surface of the lower electrode 14.

The above-described nonvolatile memory device can operate similarly to general resistance change nonvolatile memory elements. That is, the resistance change portion 18p is set to one of a crystalline state (low resistance state) and an amorphous state (high resistance state) by controlling voltage pulses (current pulses) applied to the resistance change portion 18p of the predetermined material film 18. Consequently, binary information can be stored by setting a desired resistance state.

A method of manufacturing a resistance change nonvolatile memory device according to the embodiment will now be described with reference to FIGS. 5A to 8A (cross-sectional views) and FIGS. 5B to 8B (plan views).

First, as illustrated in FIGS. 5A and 5B, a rectifying element (not illustrated) and the lower electrode (10 nm in thickness) 14 are formed in a cylindrical shape on a word line (not illustrated), and the interlayer insulating film 16 is formed around the word line, the rectifying element and the lower electrode 14. Tungsten (W) is used for the lower electrode 14 and a silicon oxide film is used for the interlayer insulating film 16. In this way, a lower structure including the lower electrode (first conductive portion) 14 and the interlayer insulating film 16 surrounding the side surface of the first conductive portion is formed.

Figure 6A:
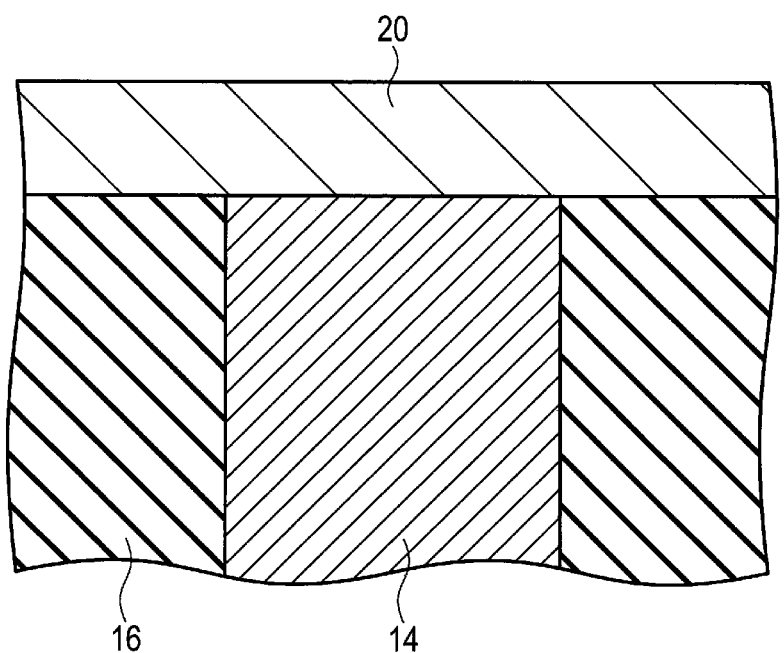
FIG. 6A is a cross-sectional view schematically illustrating a part of the method of manufacturing the nonvolatile memory device according to the first embodiment.
Figure 6B:
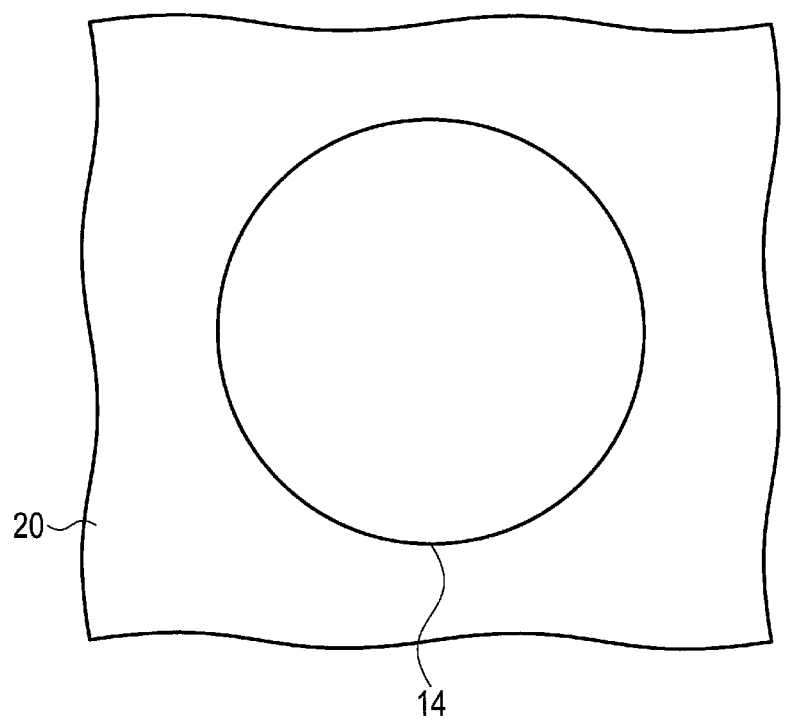
FIG. 6B is a plan view schematically illustrating the part of the method of manufacturing the nonvolatile memory device according to the first embodiment.

Then, as illustrated in FIGS. 6A and 6B, a metal film 20 is formed on the lower structure, which is formed in the process in FIGS. 5A and 5B. Specifically, a titanium (Ti) film having a thickness of 4 nm is formed as the metal film 20.

Figure 7A:
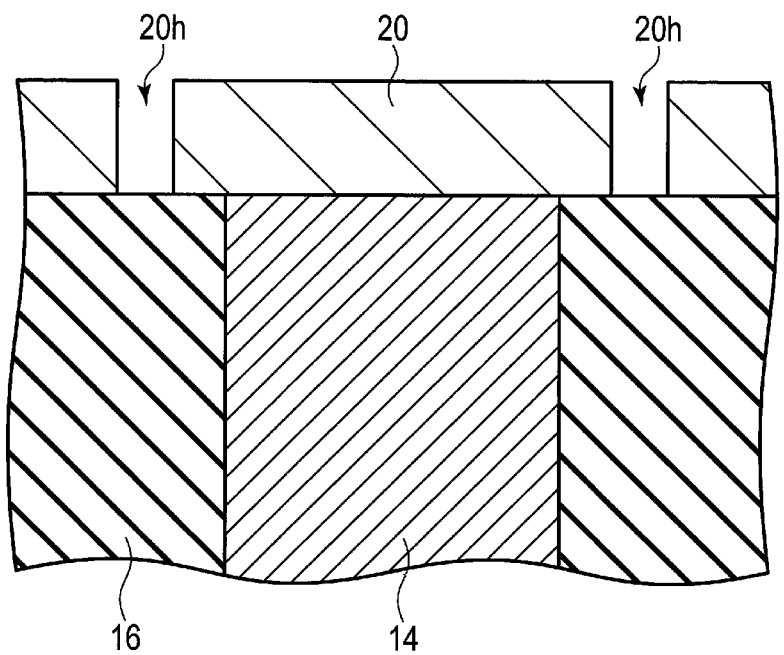
FIG. 7A is a cross-sectional view schematically illustrating a part of the method of manufacturing the nonvolatile memory device according to the first embodiment.
Figure 7B:
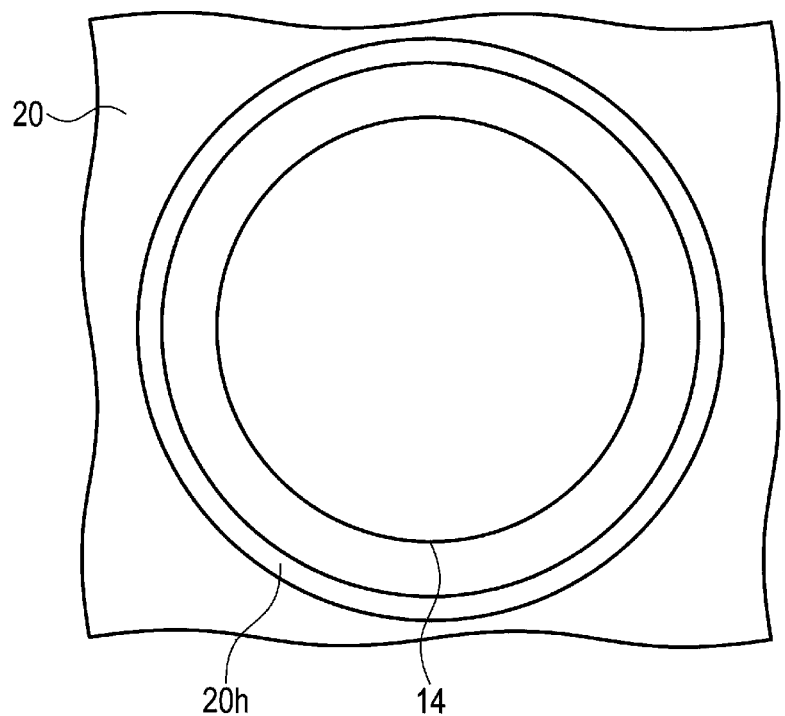
FIG. 7B is a plan view schematically illustrating the part of the method of manufacturing the nonvolatile memory device according to the first embodiment.

Then, as illustrated in FIGS. 7A and 7B, the metal film 20 is corroded. As a result, a ring-shaped hole 20h surrounding the lower electrode 14 is formed as viewed from a direction perpendicular to the upper surface of the lower electrode 14. That is, titanium (Ti) used for the metal film 20 has a higher ionization tendency than tungsten (W) used for the lower electrode 14. Consequently, local battery effects occur due to moisture ($H_2O$) contained in the interlayer insulating film 16, and the metal film 20 near the lower electrode 14 corrodes. As a result, the metal film 20 near the lower electrode 14 is removed, and a ring-shaped (circular) hole (groove) 20h is formed.

Then, as illustrated in FIGS. 8A and 8B, the metal film 20 having the ring-shaped hole is oxidized by ashing to form an insulating metal oxide layer (intermediate layer 17). Specifically, a titanium oxide ($TiO_x$) layer is formed as the intermediate layer 17. The intermediate layer 17 has a ring-shaped (circular) hole (groove) 17h. In this way, the intermediate layer 17 having the ring-shaped hole 17h near the upper edge of the lower electrode 14 is formed.

Then, as illustrated in FIGS. 3A and 3S, the predetermined material film 18 is formed on the Intermediate layer 17 and in the ring-shaped hole 17h. Specifically, a superlattice film (40 nm in thickness) containing $Sb_2Te_3$ and GeTe is formed as the predetermined material film 18. As already described above, the predetermined material film 18 is crystal-grown starting from the ring-shaped hole (ring-shaped groove) 17h. As a result, three regular hexagonal crystal grains each centered on the three division points D1, D2, and D3 of the ring are formed as viewed from the direction perpendicular to the upper surface of the lower electrode 14. Consequently, the triple point 19t in which the crystal grain boundaries of the three crystal grains are gathered is obtained.

Furthermore, a pattern of a bit line (not illustrated) is formed on the predetermined material film 18 and above the lower electrode 14. Then, a voltage is applied between the word line 12 and the bit line 13 (between the lower electrode 14 and the bit line 13). As a result, the intermediate layer 17 undergoes dielectric breakdown (electrostatic breakdown) at the position of triple point 19t, and a pinhole is generated. The pinhole functions as a current path, and a region near the pinhole of the predetermined material film 18 becomes the resistance change portion 18p.

As described above, according to the embodiment, the predetermined material film 18 is formed starting from the hole 17h formed in the intermediate layer 17, and the triple point 19t is formed in the predetermined material film 18. A resistance change nonvolatile memory element can be obtained by using the resistance change portion 18p of the predetermined material film 18, which is provided at a position corresponding to the triple point 19t. As a result, a resistance change nonvolatile memory device having excellent performance in terms of lowering current can be obtained.

Second Embodiment

A second embodiment will now be described. Note that, since the basic matters are similar to those of the first embodiment, the description of the matters already described in the first embodiment will be omitted.

In the above-described first embodiment, the triple point 19t is formed by crystal growth of the predetermined material film 18 starting from the ring-shaped hole 17h, which is formed by using the difference in an ionization tendency. In the embodiment, a triple point 19t is formed by using a hole formed by lithography.

Figure 9:
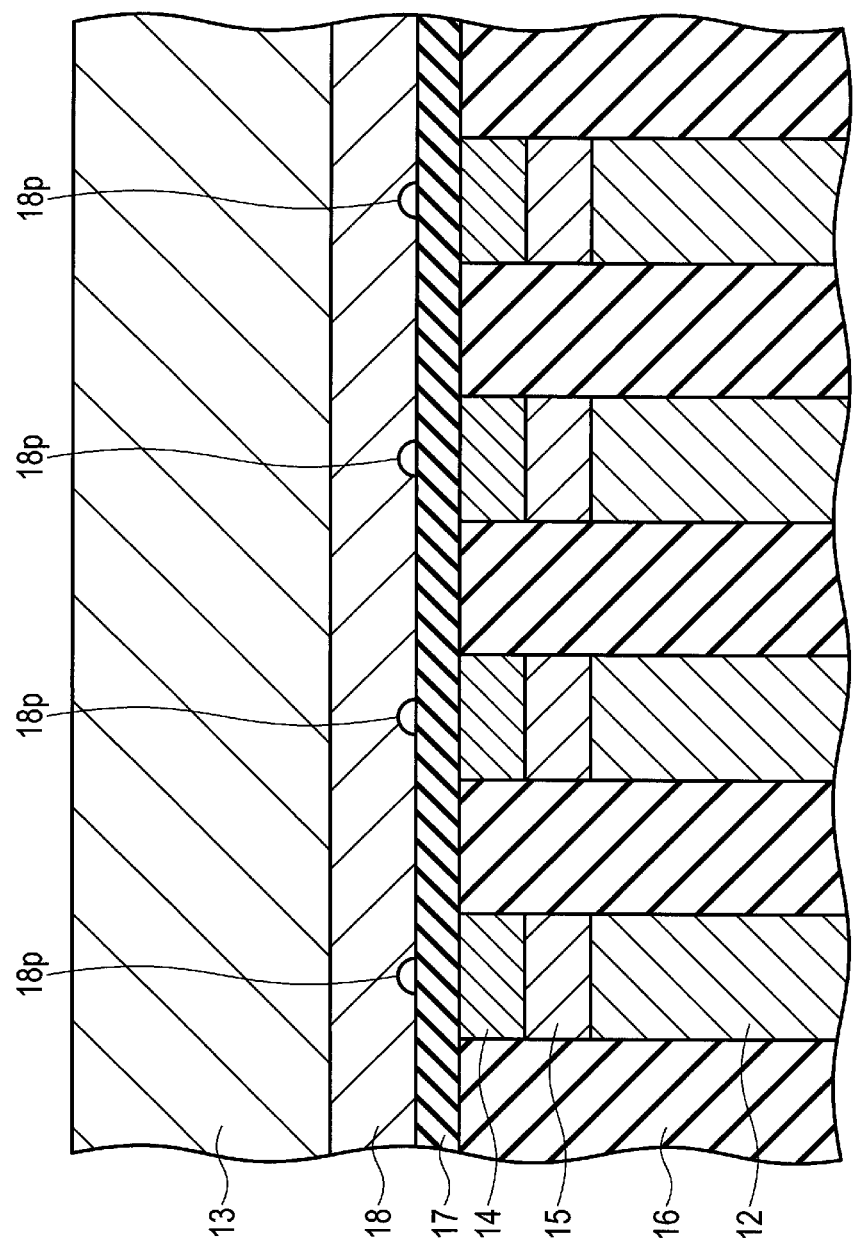
FIG. 9 is a cross-sectional view schematically illustrating a configuration of a resistance change nonvolatile memory device according to a second embodiment.
Figure 10:
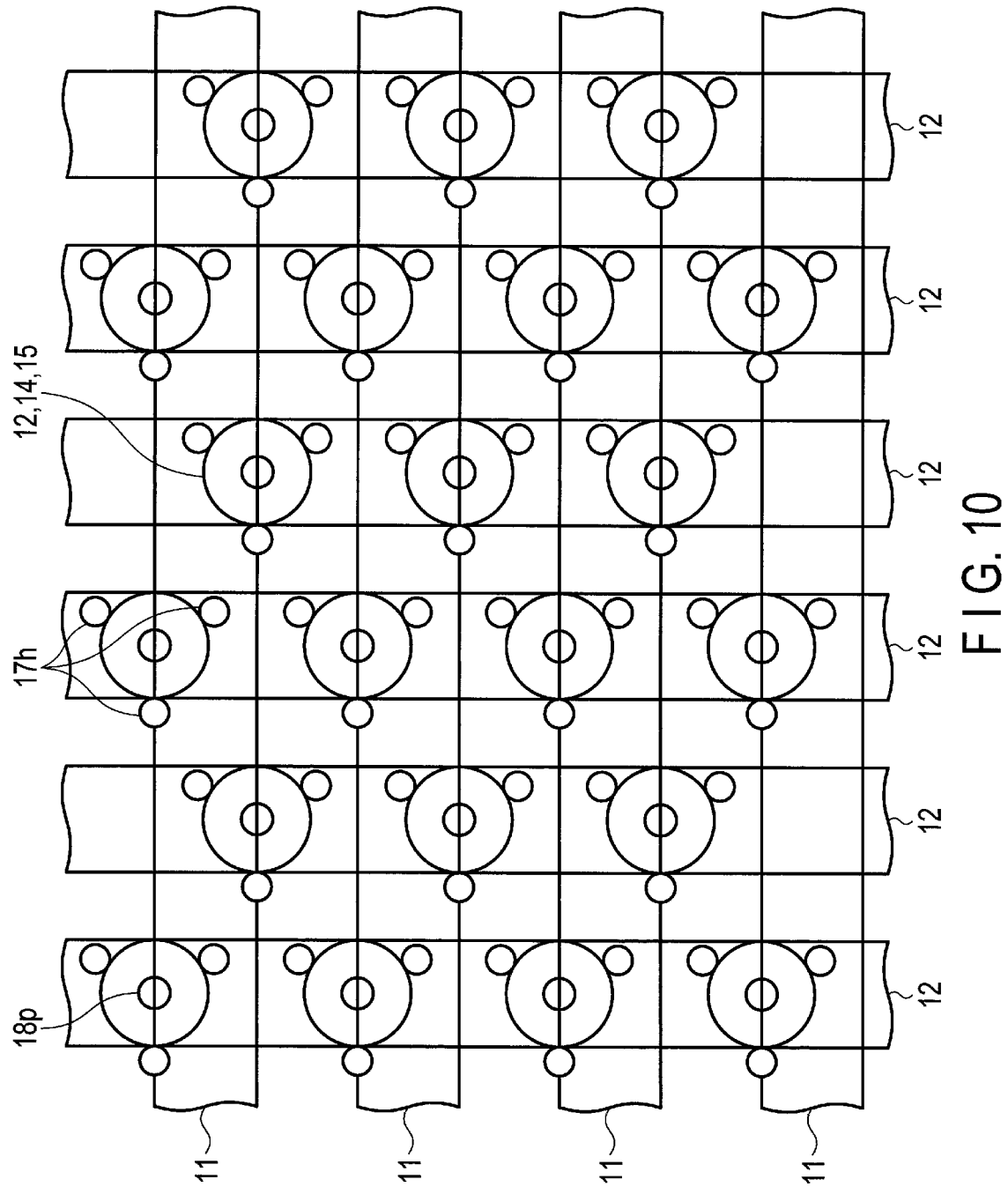
FIG. 10 is a plan view schematically illustrating the configuration of the resistance change nonvolatile memory device according to the second embodiment.

FIG. 9 is a cross-sectional view schematically illustrating a configuration of a resistance change nonvolatile memory device according to the second embodiment. FIG. 10 is a plan view schematically illustrating the configuration of the resistance change nonvolatile memory device according to the second embodiment.

In the embodiment, the intermediate layer 17 has three holes 17h near un upper edge of a lower electrode 14. The three holes 17h are positioned at three vertices of a regular triangle formed by connecting the three holes 17h with straight lines. In addition, similarly to the first embodiment, a resistance change portion 18p is located at a central portion of the upper surface of the lower electrode 14 as viewed from a direction perpendicular to the upper surface of the lower electrode 14.

FIGS. 11 to 19 are plan views schematically illustrating a method of manufacturing the resistance change nonvolatile memory device according to the embodiment.

First, as illustrated in FIG. 11, similarly to the first embodiment, a rectifying element (not illustrated) and a lower electrode (10 nm in thickness) 14 are formed in a cylindrical shape on a word line (not illustrated), and an interlayer insulating film (not illustrated) is formed around the word line, the rectifying element and the lower electrode 14.

Then, as illustrated in FIG. 12, a first core material pattern 21 is formed on the lower electrode 14 and the interlayer insulating film (not illustrated) by lithography. The first core material pattern 21 is arranged at a predetermined pitch and extends in a first direction.

Figure 13:
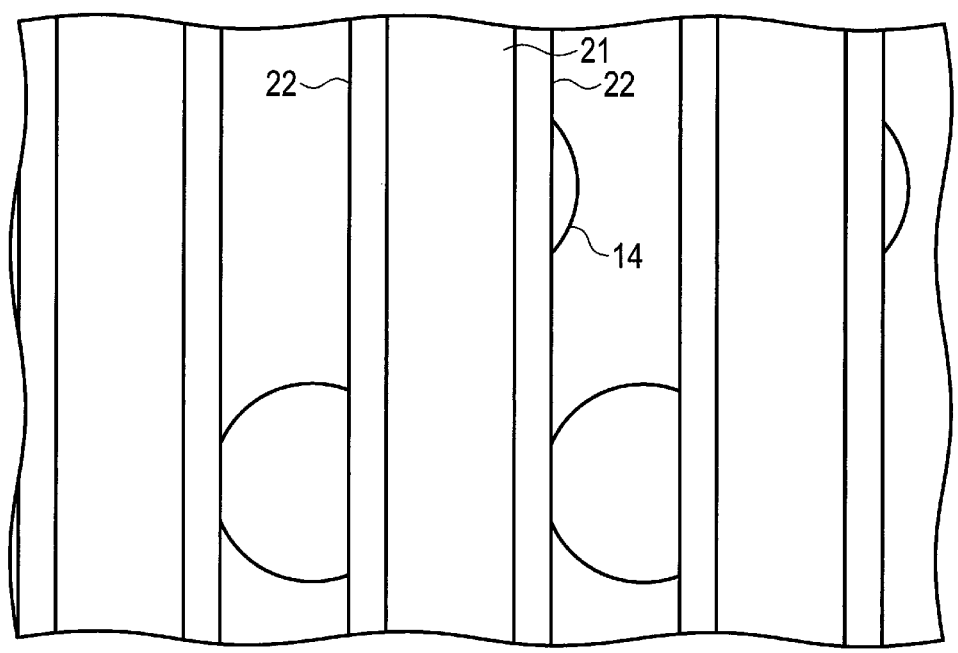
FIG. 13 is a plan view schematically illustrating a part of the method of manufacturing the nonvolatile 10, memory device according to the second embodiment.

Then, as illustrated in FIG. 13, a pair of first sidewall insulating patterns 22 is formed on side walls of the first core material pattern 21. Specifically, the pair of first sidewall insulating patterns 22 is formed by forming an insulating film for the first sidewall insulating patterns 22 on the entire surface, and anisotropically etching the insulating film.

Figure 14:
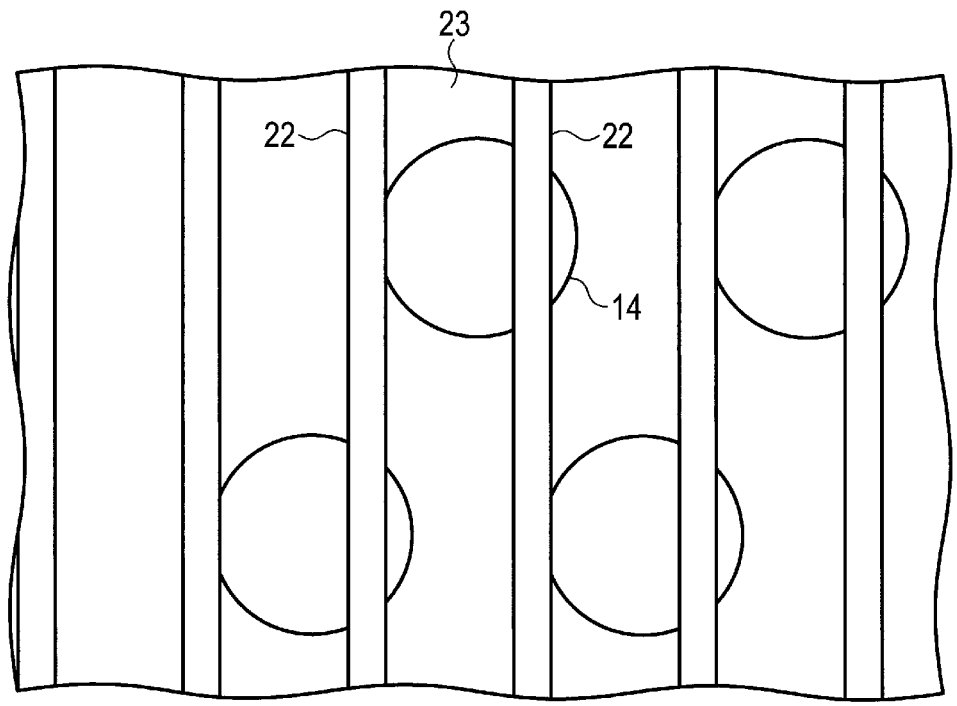
FIG. 14 is a plan view schematically illustrating a part of the method of manufacturing the nonvolatile memory device according to the second embodiment.

Then, as illustrated in FIG. 14, the first core material pattern 21 is removed. As a result, the first sidewall insulating patterns 22 remain.

Figure 15:
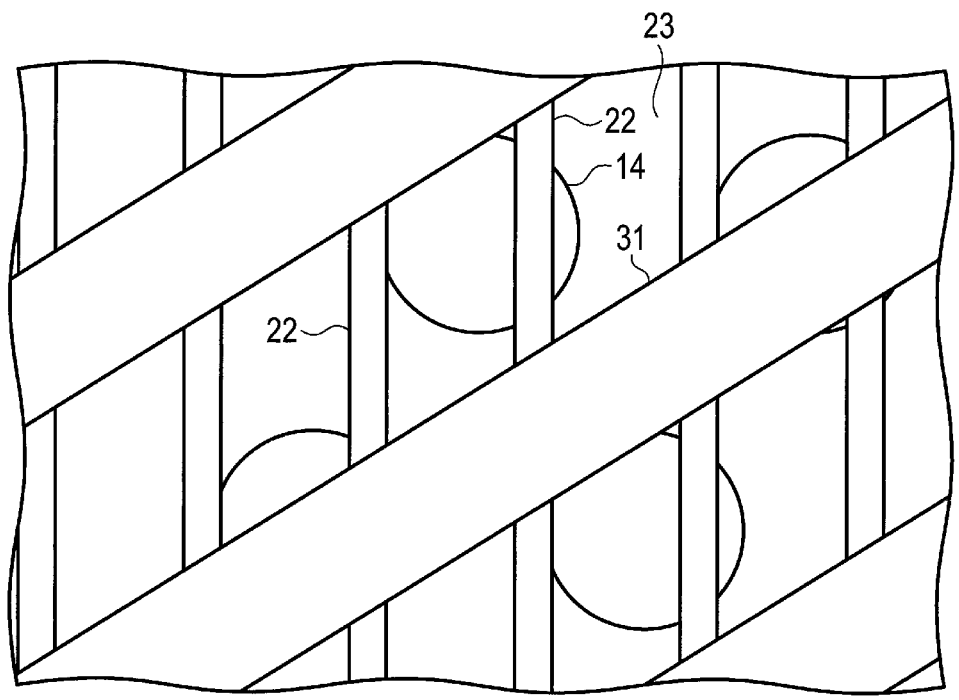
FIG. 15 is a plan view schematically illustrating a part of the method of manufacturing the nonvolatile memory device according to the second embodiment.

Then, as illustrated in FIG. 15, a region between the first sidewall insulating patterns 22 is filled with a first insulating film 23, and a second core material pattern 31 is formed on the first sidewall insulating patterns 22 and the first insulating film 23 by lithography. The second core material pattern 31 is arranged at a predetermined pitch, and extends in a second direction at an angle of 60 degrees with respect to the extending direction (first direction) of the first sidewall insulating patterns 22.

Figure 16:
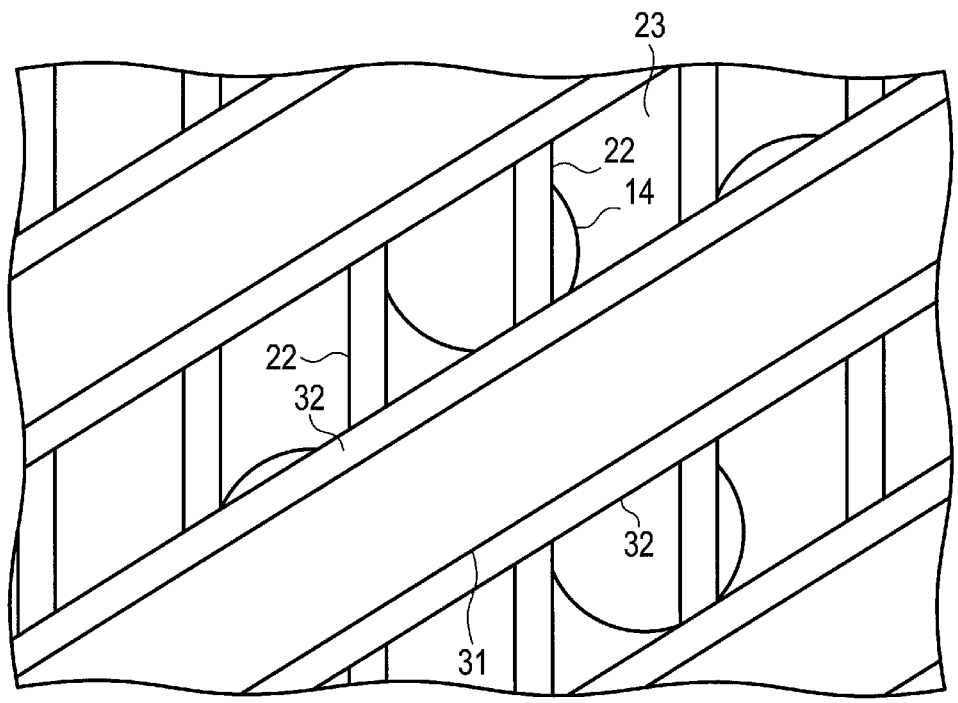
FIG. 16 is a plan view schematically illustrating a part of the method of manufacturing the nonvolatile memory device according to the second embodiment.

Then, as illustrated in FIG. 16, a pair of second sidewall insulating patterns 32 is formed on side walls of the second core material pattern 31. Specifically, the pair of second sidewall insulating patterns 32 is formed by forming an insulating film for the second sidewall insulating patterns 32 on the entire surface, and anisotropically etching the insulating film.

Then, as illustrated in FIG. 17, the second core material pattern 31 is removed. As a result, the second sidewall insulating patterns 32 remain.

Then, as illustrated in FIG. 18, a region between the second sidewall insulating patterns 32 is filled with a second insulating film 33, and the first sidewall insulating patterns 22 and the second sidewall insulating patterns 32 are selectively etched with respect to the first insulating film 23 and the second insulating film 33. As a result, a hole 17h is formed at the intersection of the first sidewall insulating pattern 22 and the second sidewall insulating pattern 32. That is, the hole 17h is formed in an intermediate layer 17 formed of the first sidewall insulating pattern 22, the first insulating film 23, and the second insulating film 33. The first sidewall insulating pattern 22 and the second sidewall insulating pattern 32 intersect at an angle of 60 degrees. Consequently, three holes 17h can be formed near the upper edge of the lower electrode 14 by optimizing a position and a pitch of the first sidewall insulating patterns 22 and a position and a pitch of the second sidewall insulating patterns 32. These three holes 17h are placed at equal distances from the center of the pattern of the lower electrode 14, and three holes 17h are positioned at three vertices of a regular triangle, which is formed by connecting the three holes 17h with straight lines.

Figure 19:
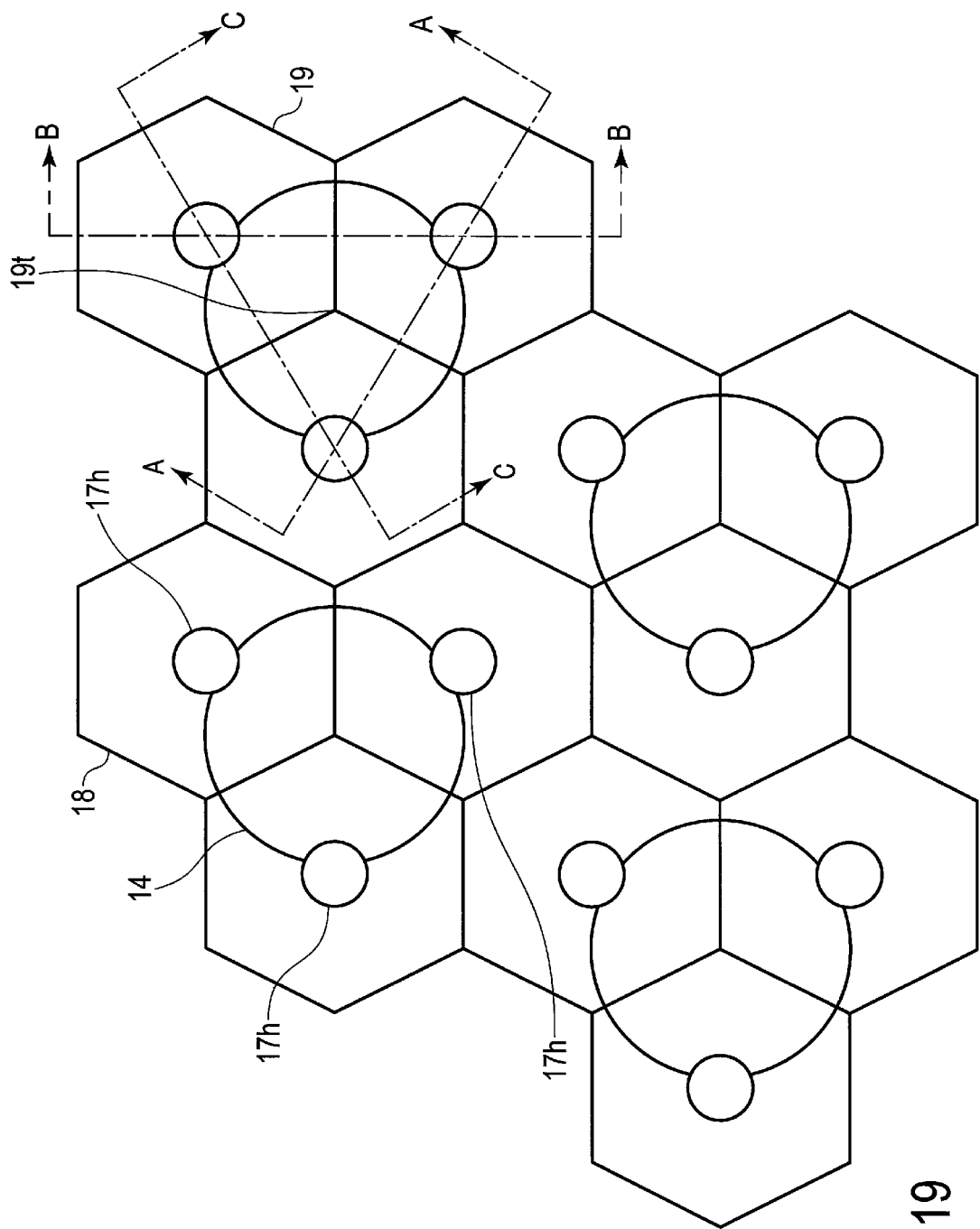
FIG. 19 is a plan view schematically illustrating a part of the method of manufacturing the nonvolatile memory device according to the second embodiment.

Then, as illustrated in FIG. 19, a predetermined material film 18 is formed on the above-described second insulating film 33 and in the hole 17h. The predetermined material film 18 is crystal-grown starting from the three holes 17h. As described above, the three holes 17h are placed at three vertices of a regular triangle. Thus, three regular hexagonal crystal grains 19 each centered on three holes 17h are formed as viewed from the direction perpendicular to the upper surface of the lower electrode 14. As a result, a triple point 19t in which the crystal grain boundaries of the three crystal grains 19 are gathered is obtained.

FIGS. 20A, 20B, and 20C each illustrate cross sections respectively taken along lines A-A, B-B, and C-C of FIG. 19.

Furthermore, a pattern of a bit line (not illustrated) is formed on the predetermined material film 18 and above the lower electrode 14. Then, a voltage is applied between the word line 12 and the bit line (between the lower electrode 14 and the bit line). As a result, the intermediate layer 17 undergoes dielectric breakdown (electrostatic breakdown) at the position of triple point 19t, and a pinhole is generated. The pinhole functions as a current path, and a region near the pinhole of the predetermined material film 18 is defined as the resistance change portion 18p.

As described above, according to the embodiment, the triple point 19t can be reliably formed with good controllability by forming the predetermined material film 18 starting from the three holes 17h formed in the intermediate layer 17. A resistance change nonvolatile memory element can be obtained by using the resistance change portion 18p of the predetermined material film 18, which is obtained at a position corresponding to the triple point 19t. As a result, a resistance change nonvolatile memory device having excellent performance in terms of lowering current can be obtained.

In addition, in the embodiment, the hole 17h is formed by using the first sidewall insulating pattern 22 and the second sidewall insulating pattern 32. Consequently, a hole pattern can be formed in high density, and an integrated circuit that is highly integrated can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
    a first conductive portion;
    an insulating film surrounding a side surface of the first conductive portion;
    an intermediate layer provided on the first conductive portion and the insulating film;
    a first film including a first portion provided on the intermediate layer and at least one second portion provided in the intermediate layer and outside an upper edge of the first conductive portion, the first film including, above the first conductive portion, a resistance change portion that has a first resistance state and a second resistance state having resistance higher than resistance in the first resistance state; and
    a second conductive portion provided at least on the resistance change portion,
    wherein the resistance change portion is located at a position corresponding to a position where crystal grain boundaries of three crystal grains contained in the first film are gathered.

2. The nonvolatile memory device according to claim 1, wherein the resistance change portion exhibits one of the first resistance state and the second resistance state based on a phase change.

3. The nonvolatile memory device according to claim 1, wherein the first film is formed of a superlattice film containing $Sb_2Te_3$ and GeTe.

4. The nonvolatile memory device according to claim 1, wherein the resistance change portion is located at a central portion of an upper surface of the first conductive portion as viewed from a direction perpendicular to the upper surface of the first conductive portion.

5. The nonvolatile memory device according to claim 1, wherein a number of the at least one second portion is three.

6. The nonvolatile memory device according to claim 1, wherein the resistance change portion is included in the first portion.

7. The nonvolatile memory device according to claim 1, further comprising a third conductive portion, and a rectifying element connected between the first conductive portion and the third conductive portion.

8. The nonvolatile memory device according to claim 1, wherein the intermediate layer is formed of a metal oxide.

9. The nonvolatile memory device according to claim 8, wherein the at least one second portion surrounds the first conductive portion in a ring shape as viewed from a direction perpendicular to an upper surface of the first conductive portion.

10. The nonvolatile memory device according to claim 8, wherein a metallic element contained in the metal oxide has a higher ionization tendency than a metallic element contained in the first conductive portion.

11. A method of manufacturing a nonvolatile memory device, comprising:
    forming a structure including a first conductive portion and a first insulating film surrounding a side surface of the first conductive portion;

forming, on the first conductive portion and the first insulating film, an intermediate layer having at least one hole outside an upper edge of the first conductive portion;

forming a first film on the intermediate layer and in the at least one hole;

forming a second conductive portion on the first film and at least above the first conductive portion; and making a portion of the first film located above the first conductive portion into a resistance change portion that has a first resistance state and a second resistance state having resistance higher than resistance in the first resistance state, by applying a voltage between the first conductive portion and the second conductive portion to cause dielectric breakdown in the intermediate layer.

12. The method according to claim 11, wherein forming the intermediate layer having the at least one hole includes:

forming a metal film on the first conductive portion and the first insulating film;

forming a ring-shaped hole surrounding the first conductive portion as viewed from a direction perpendicular to an upper surface of the first conductive portion by corroding the metal film; and forming the intermediate layer by oxidizing the metal film having the ring-shaped hole.

13. The method according to claim 11, Therein forming the intermediate layer having the at least one hole includes:

forming a second insulating film on the first conductive portion and the first insulating film; and forming three holes at portions of the second insulating film which are located outside an upper edge of the first conductive portion.

14. The method according to claim 11, wherein forming the intermediate layer having the at least one hole includes:

forming a first core material pattern extending in a first direction on the first conductive portion and the first insulating film;

forming a pair of first sidewall insulating patterns on both side walls of the first core material pattern;

removing the first core material pattern to leave the pair of first sidewall insulating patterns;

forming a second insulating film in a region between the pair of first sidewall insulating patterns and a region outside the pair of first sidewall insulating patterns;

forming a second core material pattern extending in a second direction on the pair of first sidewall insulating patterns and the second insulating film;

forming a pair of second sidewall insulating patterns on both side walls of the second core material pattern;

removing the second core material pattern to leave the pair of second sidewall insulating patterns;

forming a third insulating film in a region between the pair of second sidewall insulating patterns and a region outside the pair of second sidewall insulating patterns; and selectively removing the pair of first sidewall insulating patterns and the pair of second sidewall insulating patterns with respect to the second insulating film and the third insulating film.

\* \* \* \* \*